(12) United States Patent
Kamiyama

(10) Patent No.: US 11,145,576 B2
(45) Date of Patent: Oct. 12, 2021

(54) ELECTRONIC MODULE

(71) Applicant: SHINDENGEN ELECTRIC MANUFACTURING CO., LTD., Tokyo (JP)

(72) Inventor: Yoshihiro Kamiyama, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/753,313

(22) PCT Filed: Nov. 10, 2017

(86) PCT No.: PCT/JP2017/040506
§ 371 (c)(1),
(2) Date: Apr. 2, 2020

(87) PCT Pub. No.: WO2019/092839
PCT Pub. Date: May 16, 2019

(65) Prior Publication Data
US 2020/0243424 A1    Jul. 30, 2020

(51) Int. Cl.
*H01L 23/495* (2006.01)
*H01L 23/31* (2006.01)
*H01L 23/00* (2006.01)

(52) U.S. Cl.
CPC ........ *H01L 23/49551* (2013.01); *H01L 23/31* (2013.01); *H01L 23/49524* (2013.01);
(Continued)

(58) Field of Classification Search
CPC ............... H01L 23/31; H01L 23/49524; H01L 23/49548; H01L 23/49551;
(Continued)

(56) References Cited

U.S. PATENT DOCUMENTS

| | | |
|---|---|---|
| 2002/0033541 A1 | 3/2002 | Uchida |
| 2007/0075406 A1 | 4/2007 | Ho et al. |
| 2012/0068357 A1 | 3/2012 | Saito et al. |
| 2014/0027890 A1* | 1/2014 | Ghai .................. H01L 23/4951 257/669 |

(Continued)

FOREIGN PATENT DOCUMENTS

| | | |
|---|---|---|
| JP | 2002100716 A | 4/2002 |
| JP | 2007335538 A | 12/2007 |

(Continued)

OTHER PUBLICATIONS

International Search Report in the international application No. PCT/JP2017/040506, dated Jan. 23, 2018.

(Continued)

*Primary Examiner* — Allan R Wilson
(74) *Attorney, Agent, or Firm* — Ladas & Parry, LLP

(57) ABSTRACT

An electronic module comprises a sealing part 90, a rear surface-exposed conductor 10, 20, 30, a rear surface-unexposed conductor 40, 50 and a second connector 70 for electrically connecting an electronic element 15, 25 to the rear surface-unexposed conductor 40, 50. The rear surface-unexposed conductor 40, 50 is positioned on a front surface side compared with the rear surface-exposed part 12, 22, 32. The second connection tip part 72 is positioned on a rear surface side compared with the second connection base part 71. A distance H in a thickness direction between a rear surface side end part of the second connection base part 71 and a rear surface side end part of the second connection tip part 72 is larger than a width W of the second connection tip part 72 of the second connector 70.

8 Claims, 16 Drawing Sheets

(52) U.S. Cl.
CPC .. *H01L 23/49562* (2013.01); *H01L 23/49575* (2013.01); *H01L 24/37* (2013.01); *H01L 24/40* (2013.01); *H01L 2224/3701* (2013.01); *H01L 2924/183* (2013.01)

(58) Field of Classification Search
CPC ......... H01L 23/49562; H01L 23/49575; H01L 24/37; H01L 24/40; H01L 24/41
See application file for complete search history.

(56) References Cited

U.S. PATENT DOCUMENTS

| | | | |
|---|---|---|---|
| 2015/0221582 | A1 | 8/2015 | Miyakawa |
| 2016/0365303 | A1 | 12/2016 | Watanabe et al. |
| 2018/0040487 | A1* | 2/2018 | Takahashi ............... H01L 23/28 |

FOREIGN PATENT DOCUMENTS

| | | |
|---|---|---|
| JP | 2009238859 A | 10/2009 |
| JP | 2012069640 A | 4/2012 |
| JP | 2017005165 A | 1/2017 |

OTHER PUBLICATIONS

Written Opinion of the International Searching Authority in the international application No. PCT/JP2017/040506, dated Jan. 23, 2018 and English translation provided by Google Translate.

Search Report in the Netherlands Patent application No. 2021879, dated Jul. 5, 2019 with English translation provided by Google Translate.

Decision to Grant a Patent in Japanese patent application No. 2018-507662, dated Dec. 26, 2018.

* cited by examiner

ELECTRONIC MODULE

CROSS-REFERENCE TO RELATED APPLICATION

The present application is the U.S. national phase of PCT Application PCT/JP2017/040506 filed on Nov. 10, 2017, the disclosure of which is incorporated herein by reference in its entirety.

TECHNICAL FIELD

The present invention relates to an electronic module having a rear surface-exposed part whose rear surface is exposed from a sealing part.

BACKGROUND ART

In conventional electronic modules, control electrodes (gate electrodes) and lead terminals (lead frames) of high-side and low-side electronic elements (MOSFETs) are soldered with connectors (gate clips) (for example, refer to JP 2002-100716 A and JP 2009-238859 A).

In such an electronic module, since a control electrode (gate electrode) of an electronic element is smaller than the other input/output electrodes (source electrode and drain electrode), it is difficult to connect a control electrode and a connector, and it is necessary to stably connect one end of a lead terminal such that the connector does not fall sideways.

If a defect occurs in connection of the connector, the controllability of an electronic element is deteriorated, and the reliability of an electronic module is deteriorated.

SUMMARY OF INVENTION

Technical Problem

In view of the above, the present invention provides an electronic module capable of improving reliability by suppressing a defect in connection of a second connector.

Solution to Problem

[Concept 1]
An electronic module according to the present invention may comprise:
a sealing part;
a rear surface-exposed conductor having a rear surface-exposed side terminal part protruding outward from a side surface of the sealing part and a rear surface-exposed part whose rear surface is exposed;
a rear surface-unexposed conductor, whose rear surface is not exposed, having a rear surface-unexposed side terminal part protruding outward from a side surface of the sealing part;
an electronic element provided in the sealing part and provided on a front surface of the rear surface-exposed conductor; and
a second connector for electrically connecting the electronic element to the rear surface-unexposed conductor, wherein
the rear surface-unexposed conductor may be positioned on a front surface side compared with the rear surface-exposed part,
the second connector may have a second connection tip part and a second connection base part, the second connection tip part is positioned on a rear surface side compared with the second connection base part, and
a distance H in a thickness direction between a rear surface side end part of the second connection base part and a rear surface side end part of the second connection tip part may be larger than a width W of the second connection tip part of the second connector.

[Concept 2]
In the electronic module according to Concept 1,
the distance H in the thickness direction between the rear surface side end part of the second connection base part and the rear surface side end part of the second connection tip part may be larger than the width W of the second connection tip part of the second connector.

[Concept 3]
In the electronic module according to Concept 1 or 2,
the second connection base part of the second connector may have a second hole part, and
a total value of the distance H in the thickness direction between the rear surface side end part of the second connection base part and the rear surface side end part of the second connection tip part and a diameter D of the second hole part may be larger than the width W of the second connection tip part of the second connector.

[Concept 4]
In the electronic module according to any one of Concepts 1 to 3,
the second connection base part of the second connector may have a second hole part, and
the distance H in the thickness direction between the rear surface side end part of the second connection base part and the rear surface side end part of the second connection tip part may be larger than a diameter D of the second hole part.

[Concept 5]
In the electronic module according to any one of Concepts 1 to 4,
the second connection base part of the second connector may have a second hole part, and
a diameter D of the second hole part may be equal to or larger than the width W of the second connection tip part of the second connector.

[Concept 6]
In the electronic module according to any one of Concepts 1 to 5,
the rear surface-exposed conductor may have an internal bent part bent in the sealing part, and
the rear surface-unexposed conductor may not have an internal bent part.

[Concept 7]
In the electronic module according to any one of Concepts 1 to 6,
the rear surface-exposed conductor may have a connected part which is provided between the rear surface-exposed part and the rear surface-exposed side terminal part, and whose rear surface is not exposed, and
a thickness of the connected part may be thinner than a thickness of the rear surface-exposed part and a thickness of the rear surface-exposed side terminal part.

[Concept 8]
In the electronic module according to any one of Concepts 1 to 7,
the electronic module may further comprise a fastening member insertion part provided at a peripheral part of the sealing part and configured to insert a fastening member,
the rear surface-exposed conductor may have a peripheral rear surface-exposed conductor and an inner rear surface-exposed conductor provided at a position farther from the fastening member insertion part than the peripheral rear surface-exposed conductor, and an area of the rear surface-exposed part of the peripheral rear surface-exposed conductor may be smaller than an area of the rear surface-exposed part of the inner rear surface-exposed conductor.

[Concept 9]

In the electronic module according to Concept 8, a pair of fastening member insertion parts may be provided, and in comparison with the area of the rear surface-exposed part of the inner rear surface-exposed conductor, a reduction amount of the rear surface-exposed part of the peripheral rear surface-exposed conductor on one side may be larger than a reduction amount of the rear surface-exposed part of the peripheral rear surface-exposed conductor on the other side.

Effects of Invention

In the present invention, by increasing the distance H in the thickness direction between the rear surface side end part of the second connection base part and the rear surface side end part of the second connection tip part, it is possible to sink a tip part of the second connector into a conductive adhesive and so on. Therefore, by adopting an aspect in which the distance H is larger than the width W of the tip part of the second connector, the second connector can be stably disposed. As a result, defective connection of the second connector can be suppressed, and reliability can be improved.

DESCRIPTION OF EMBODIMENTS

First Embodiment

<<Configuration>>

Figure 2:
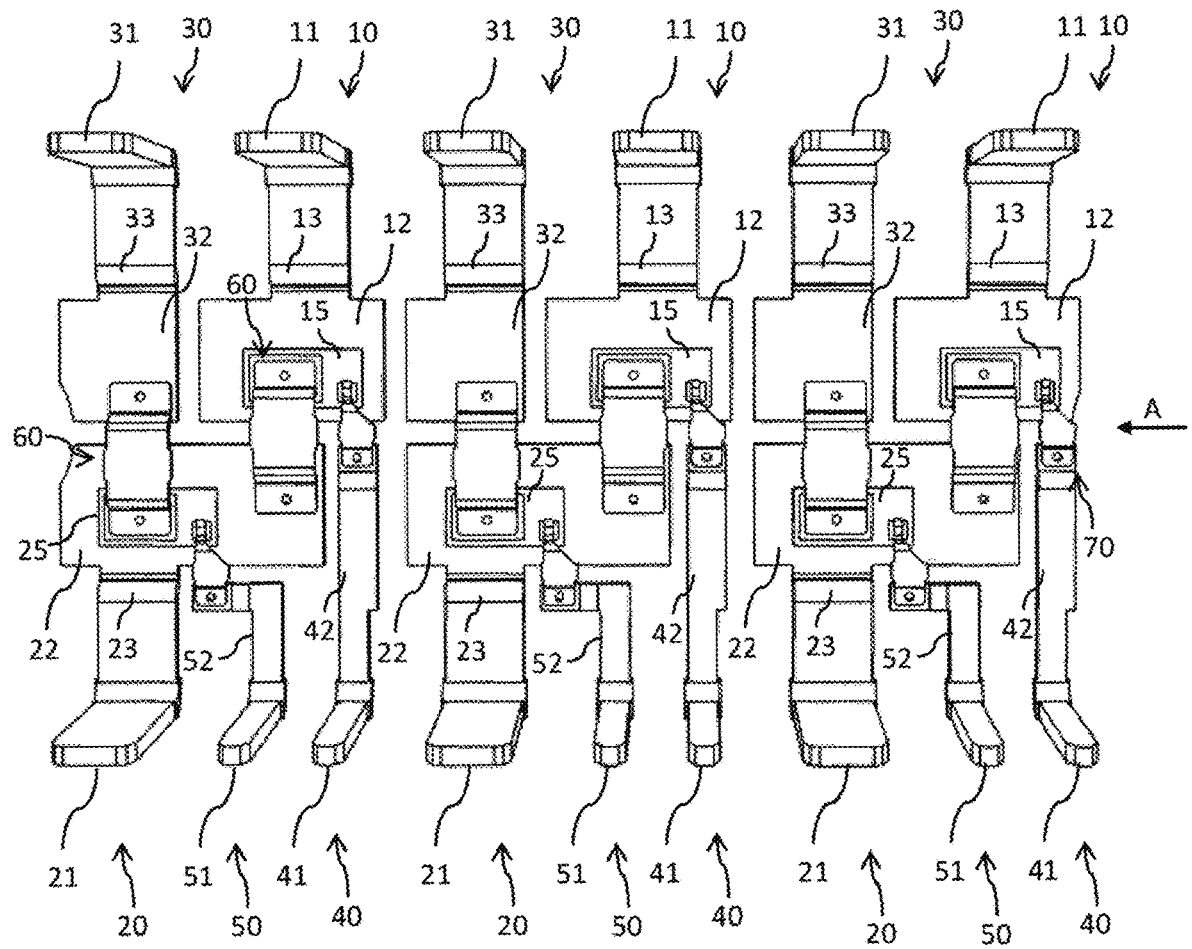
FIG. 2 is a plan view which is not illustrating a sealing part of the electronic module according to the first embodiment of the present invention.
Figure 2:
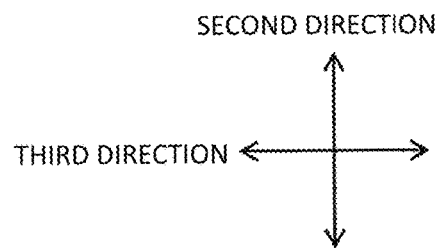
Figure 11:
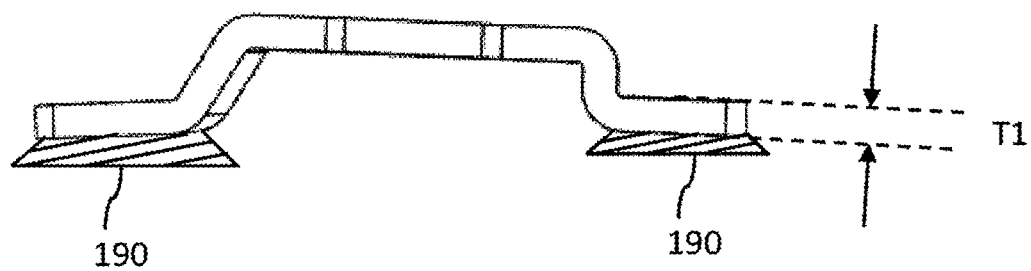
FIG. 11(a) is a side view for explaining the thickness of a first connector that can be used in the first embodiment of the present invention.
FIG. 11(b) is a side view for explaining a thickness of the second connector which can be used in the first embodiment of the present invention.
Figure 11:
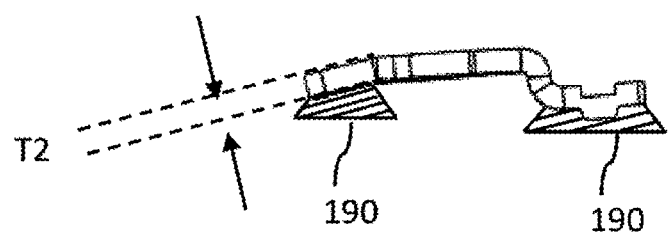

As illustrated in FIG. 2, an electronic module according to the present embodiment may have a sealing part 90 (refer to FIG. 3), rear surface-exposed conductors 10, 20 and 30, which have rear surface exposed-side terminal parts 11, 21 and 31 protruding outwardly from a side surface of the sealing part 90 and rear surface-exposed parts 12, 22 and 32 (refer to FIG. 8) whose rear surface is exposed, rear surface-unexposed conductors 40 and 50, which have rear surface unexposed-side terminal parts 41 and 51 protruding outwardly from a side surface of the sealing part 90 and whose rear surface is not exposed, a plurality of electronic elements 15 and 25, which is provided in the sealing part 90 and provided on a front surface of the rear surface-exposed conductors 10, 20, and 30 via a conductive adhesive 190 (refer to FIG. 11) such as solder, and connectors 60 and 70, which have a first connector 60 and a second connector 70. The connectors 60 and 70 have a first connector 60 and a second connector 70. In the present embodiment, a direction including a direction from the rear surface side to the front surface side of the sealing part 90 of an electronic module is referred to as a "first direction", and a direction in a plane having a normal to the first direction (an in-plane direction including the second direction and the third direction in FIG. 2) is referred to as an "in-plane direction".

The first connector 60 of the present embodiment electrically connects the rear surface-exposed conductors 10, 20, and 30 and the electronic elements 15 and 25, and the second connector 70 electrically connects the rear surface-unexposed conductors 40 and 50 and the electronic elements 15 and 25. For example, the first connector 60 may connect the front surfaces of the rear surface-exposed conductors 20 and 30 and a source electrode and the like provided on the front surface of the first electronic element 15 or the second electronic element 25 with the conductive adhesive 190. The second connector 70 may connect the front faces of the rear surface-unexposed conductors 40 and 50 and a gate electrode and the like provided on the front surface of the first electronic element 15 or the second electronic element 25 with the conductive adhesive 190. However, the present invention is not limited to this. The connectors 60 and 70 may connect two rear surface-exposed conductors 10, 20 and 30 or two rear surface-unexposed conductors 40 and 50 to each other. For example, the first connector 60 may connect the two rear surface-exposed conductors 10, 20, and 30 to each other, and the second connector 70 may connect the two rear surface-unexposed conductors 40 and 50 to each other.

Figure 4:
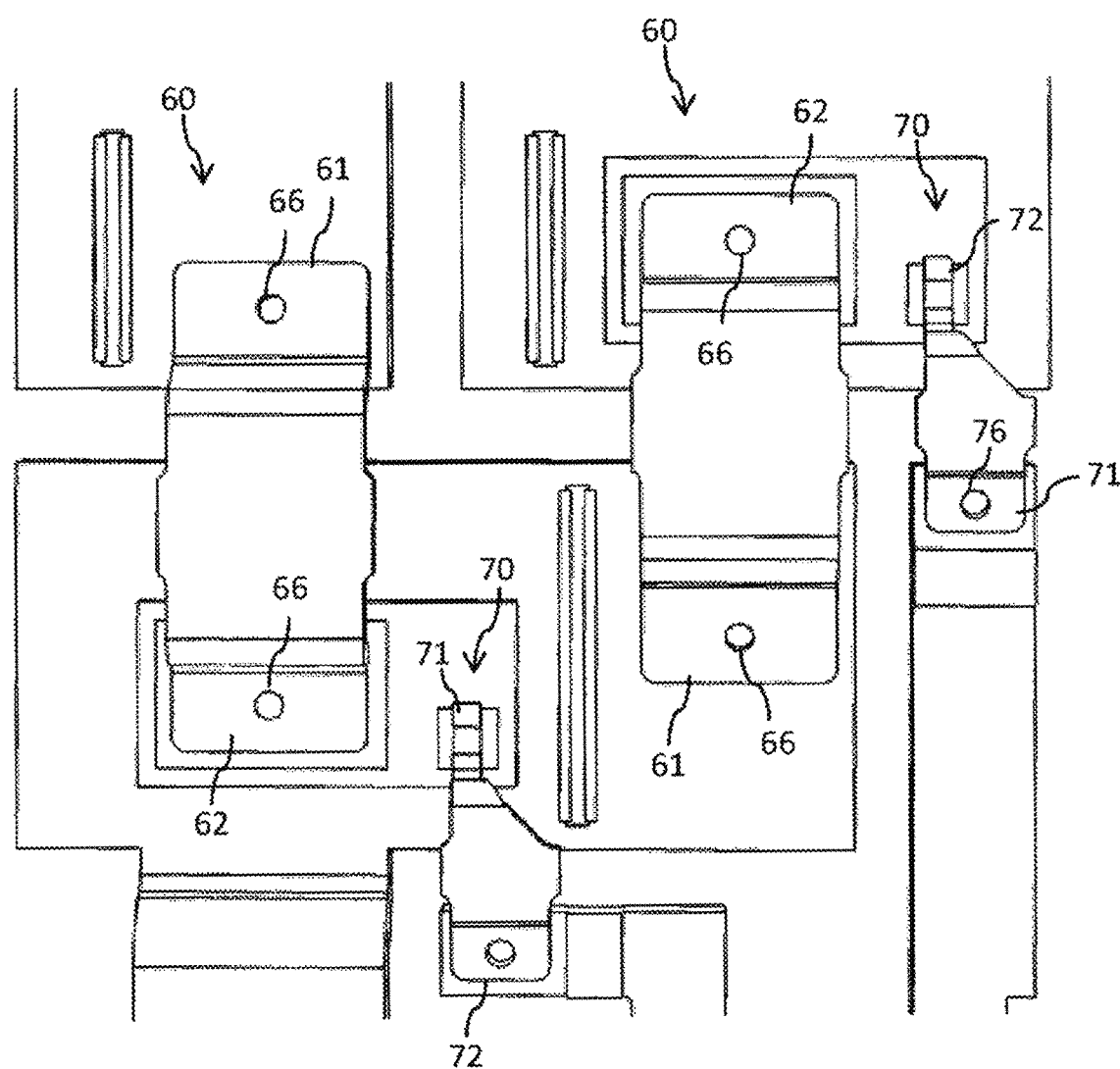
FIG. 4 is a plan view of a first connector and a second connector that can be used in the first embodiment of the present invention.

As illustrated in FIG. 4, the first connector 60 may have a first connection base end part 61 and a first connection tip end part 62 connected to the electronic elements 15 and 25 via the conductive adhesive 190. A first hole 66 may be provided in each of the first connection base end part 61 and the first connection tip end part 62. The width of the first connection base end part 61 and the width of the first connection tip end part 62 may be substantially the same. In the present embodiment, "substantially the same" means that the difference therebetween is 5% or less of a larger value. For example, W1−W0≤0.05×W1 is satisfied when W1 is a large value, and W0 is a small value in the width of the first connection base end part 61 and the width of the first connection tip end part 62.

Figure 16:
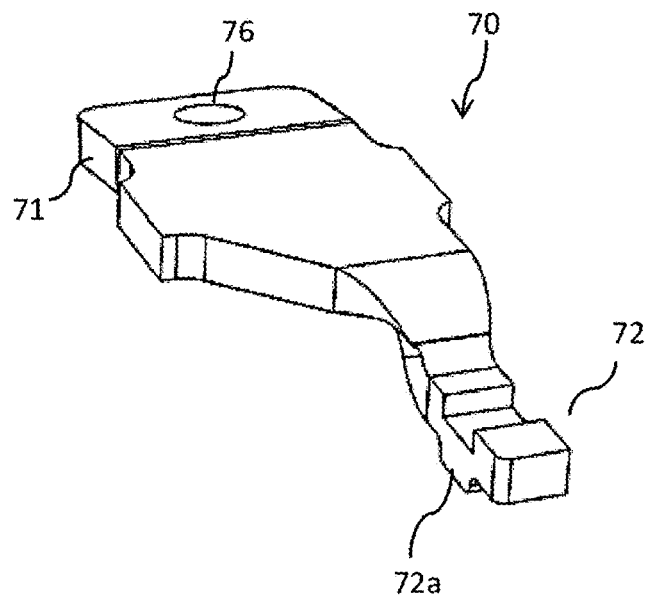
FIG. 16(a) is a perspective view of a second connector that can be used in embodiments of the present invention, when viewed from the second connection tip end part side.
FIG. 16(b) is a view of the second connector that can be used in embodiments of the present invention, when viewed from the bottom surface side.
Figure 16:
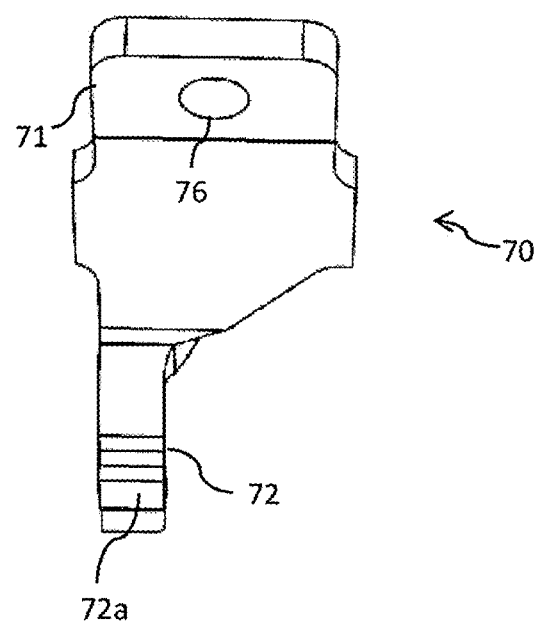

As illustrated in FIG. 4, the second connector 70 may have a second connection base end part 71 and a second connection tip end part 72, and the width of the second connection base end part 71 may be larger than the width of the second connection tip end part 72. As illustrated in FIG. 1(a), the second connector 70 may have the second connection base end part 71, the second connection base end part 71 may be provided with a second hole 76, and the second connection tip end part 72 may not be provided with the second hole 76. As illustrated in FIG. 1(b), the second connection tip end part 72 may have a rear surface side protruding part 72a protruding toward the rear surface side (also refer to FIG. 16).

Figure 1:
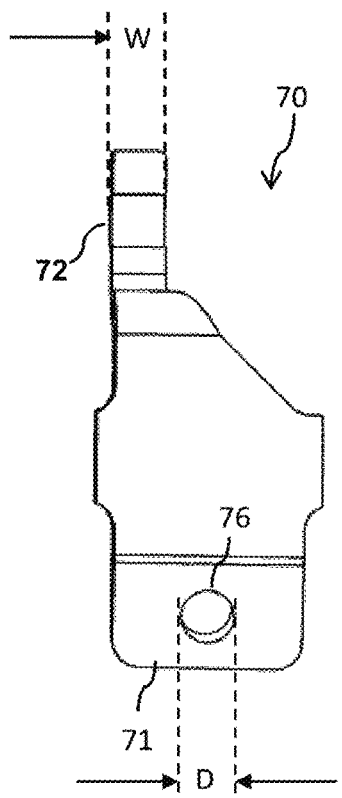
FIG. 1(a) is an enlarged plan view of a second connector that can be used in a first embodiment of the present invention.
FIG. 1(b) is an enlarged side view of the second connector that can be used in the first embodiment of the present invention and a side view when viewed from the arrow A in FIG. 2.
Figure 1:
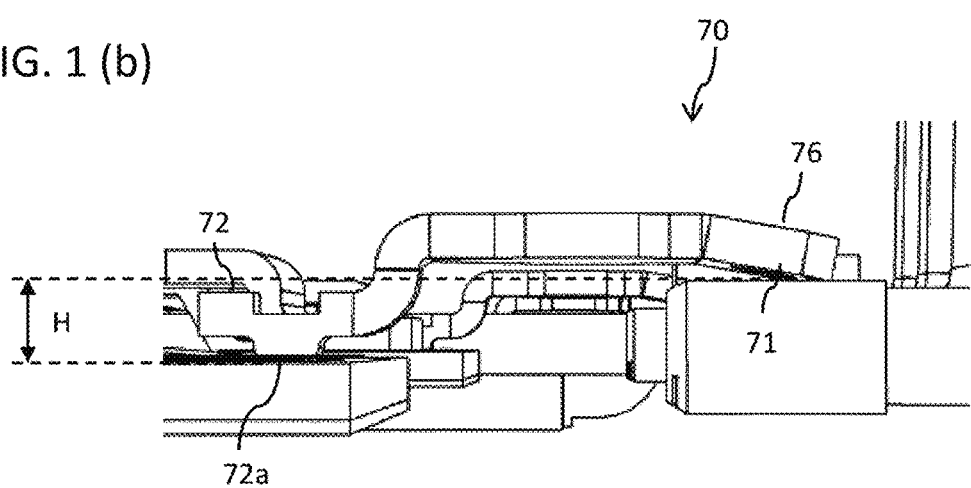

A distance H in the thickness direction between a rear surface side end part of a second connection base part 71 and a rear surface side end part of a second connection tip part 72 may be larger than a width W of the second connection tip part 72 of the second connector 70 (refer to FIG. 1).

The distance H in the thickness direction between the rear surface side end part of the second connection base part 71 and the rear surface side end part of the second connection tip part 72 may be larger than a diameter D of a second hole part 76.

The diameter D of the second hole part 76 may be equal to or larger than the width W of the second connection tip part 72 of the second connector 70.

Figure 5:
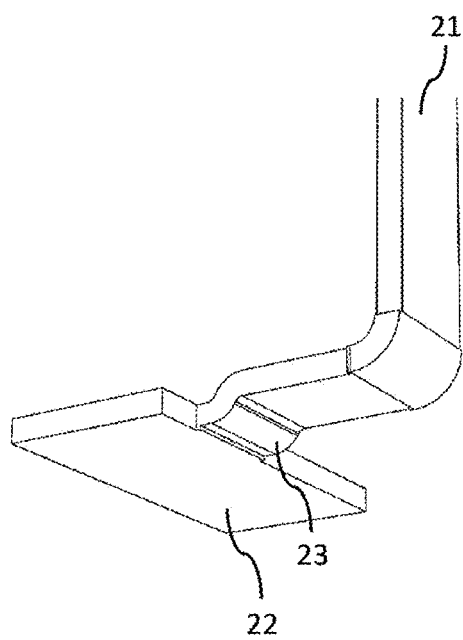
FIG. 5 is a perspective view for explaining the relationship among a second terminal part, a fourth terminal part, a fifth terminal part, and the like, which can be used in the first embodiment of the present invention.
Figure 6:
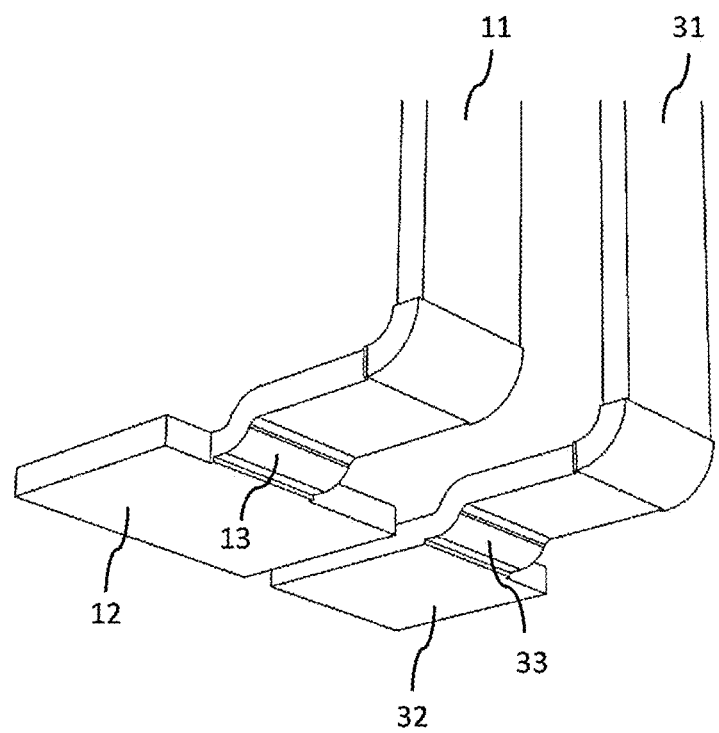
FIG. 6 is a perspective view for explaining the relationship between a first terminal part, a third terminal part, and the like, which can be used in the first embodiment of the present invention.

As illustrated in FIGS. 5 and 6, the rear surface-exposed conductors 10, 20, and 30 may have internal bent parts 13, 23, and 33 bent in the sealing part 90. On the other hand, the rear surface-unexposed conductors 40 and 50 may not have the internal bent parts. More specifically, the rear surface-exposed conductors 10, 20, and 30 may be provided between the rear surface exposed-side terminal parts 11, 21 and 31 and the rear surface-exposed parts 12, 22, and 32 and may have the internal bent parts 13, 23, and 33 bent from the rear surface-exposed parts 12, 22, and 32 to the side of the rear surface exposed-side terminal parts 11, 21 and 31 (front surface side).

The rear surface-unexposed conductors 40 and 50 may be positioned further to the front surface side than the rear surface-exposed parts 12, 22, and 32. A total value of the distance H in the thickness direction between the rear surface side end part of the second connection base part 71 and the rear surface side end part of the second connection tip part 72 and the diameter D of the second hole part 76 may be larger than the width W of the second connection tip part 72 of the second connector 70.

The rear surface-unexposed conductors 40 and 50 may have unexposed parts 42 and 52 sealed in the sealing part 90.

The electronic elements 15 and 25 are semiconductor elements such as MOSFETs, for example, and the electronic module may be a semiconductor module, for example. The present embodiment will be described using the aspect in which the rear surface-exposed parts 12, 22, and 32 and the rear surface exposed-side terminal parts 11, 21 and 31 are integrated, and the unexposed parts 42 and 52 and the back surface unexposed-side terminal parts 41 and 51 are integrated, but the present invention is not limited thereto. The rear surface-exposed parts 12, 22, and 32 and the rear surface exposed-side terminal parts 11, 21 and 31 may be separately formed and bonded to each other. Alternatively, the unexposed parts 42 and 52 and the rear surface unexposed-side terminal parts 41 and 51 may be separately formed and bonded to each other.

The rear surface-exposed conductors 10, 20, and 30 may have the first rear surface-exposed conductor 10, the second rear surface-exposed conductor 20, and the third rear surface-exposed conductor 30. The first rear surface-exposed conductor 10 may have a first terminal part 11, a first rear surface-exposed part 12, and a first internal bent part 13 provided between the first terminal part 11 and the first rear surface-exposed part 12. The second rear surface-exposed conductor 20 may have a second terminal part 21, a second rear surface-exposed part 22, and the second internal bent part 23 provided between the second terminal part 21 and the second rear surface-exposed part 22. The third rear surface-exposed conductor 30 may have a third terminal part 31, a third rear surface-exposed part 32, and a third internal bent part 33 provided between the third terminal part 31 and the third rear surface-exposed part 32.

The rear surface unexposed-side terminal parts 41 and 51 may have a fourth rear surface-unexposed conductor 40 and a fifth rear surface-unexposed conductor 50. The fourth rear surface-unexposed conductor 40 may have a fourth terminal part 41 and the fourth unexposed part 42. The fifth rear surface-unexposed conductor 50 may have a fifth terminal part 51 and a fifth unexposed part 52.

Figure 3:
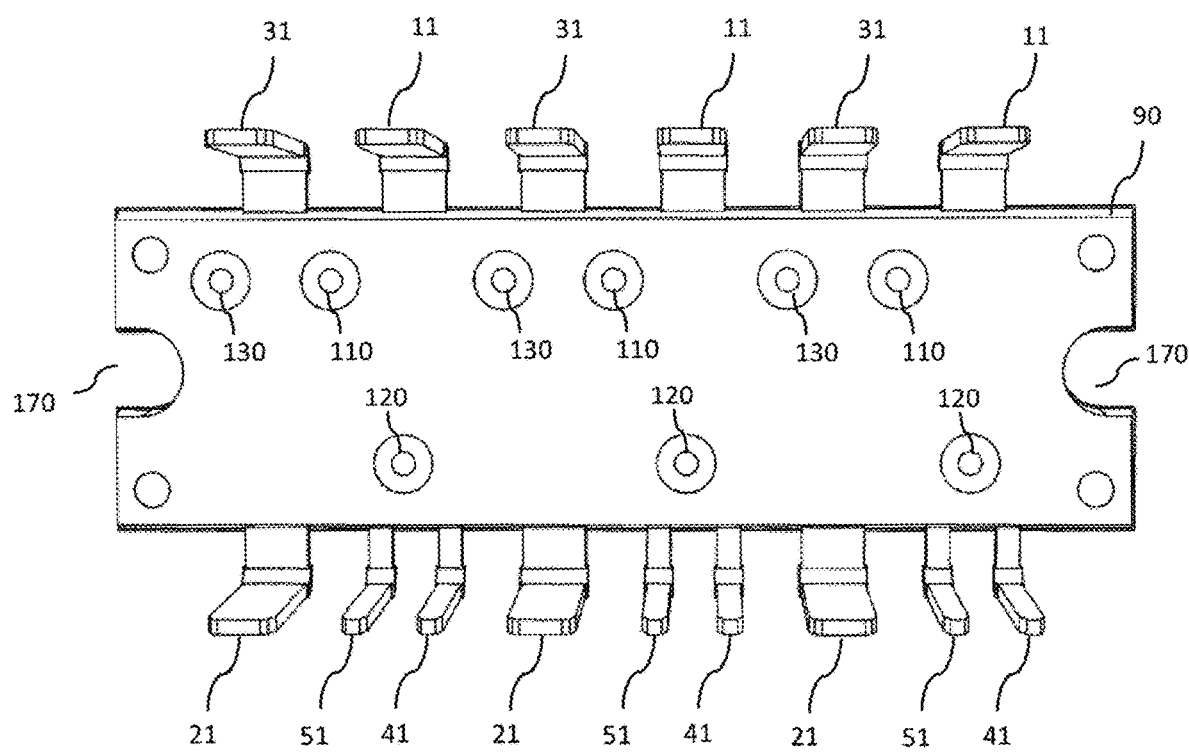
FIG. 3 is a plan view of the electronic module according to the first embodiment of the present invention.
Figure 3:
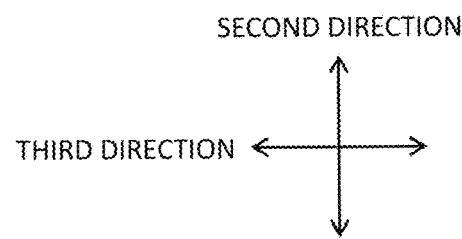

As illustrated in FIG. 2, the electronic elements 15 and 25 may have the first electronic element 15 placed on the first rear surface-exposed part 12 and the second electronic element 25 placed on the second rear surface-exposed part 22. As illustrated in FIG. 3, the second terminal part 21 and the rear surface unexposed-side terminal parts 41 and 51 may protrude outwardly from one side surface (the lower surface in FIG. 3) of the sealing part 90.

As illustrated in FIG. 2, a plurality of the second rear surface-exposed conductors 20 may be provided. The rear surface unexposed-side terminal parts 41 and 51 may be provided between at least a pair of the second rear surface-exposed parts 22, and the fourth terminal part 41 and the fifth terminal part 51 may be provided one by one between a pair of the second terminal parts 21. In the aspect illustrated in FIG. 2, the fourth unexposed part 42 integrated with the fourth terminal part 41 is provided between a pair of the second rear surface-exposed parts 22, and the fifth unexposed part 52 integrated with the fifth terminal part 51 is provided on one side surface side (the lower side in FIG. 2) of the second rear surface-exposed part 22. The rear surface unexposed-side terminal parts 41 and 51 may be connected to the electronic elements 15 and 25, respectively. In the aspect illustrated in FIG. 2, the fifth terminal part 51 is connected to the second electronic element 25 by the second connector 70 and is used for controlling the second electronic element 25, and the fourth terminal part 41 is connected to the first electronic element 15 by the second connector 70 and is used for controlling the first electronic element 15.

As illustrated in FIG. 2, the electronic elements 15 and 25 may not be placed on the third rear surface-exposed part 32. As illustrated in FIG. 3, the first terminal part 11 and the third terminal part 31 may protrude outwardly from the other side surface (the upper surface in FIG. 3) of the sealing part 90. The first terminal part 11 and the third terminal part 31 may be alternately disposed.

The rear surface-exposed conductors 10, 20, and 30 and the rear surface-unexposed conductors 40 and 50 are made of, for example, copper and a copper alloy and may be subjected to a tin plating treatment, a nickel plating treatment, or the like on the whole surface or partial surface. As the sealing part 90, an epoxy resin or the like may be used.

Figure 7:
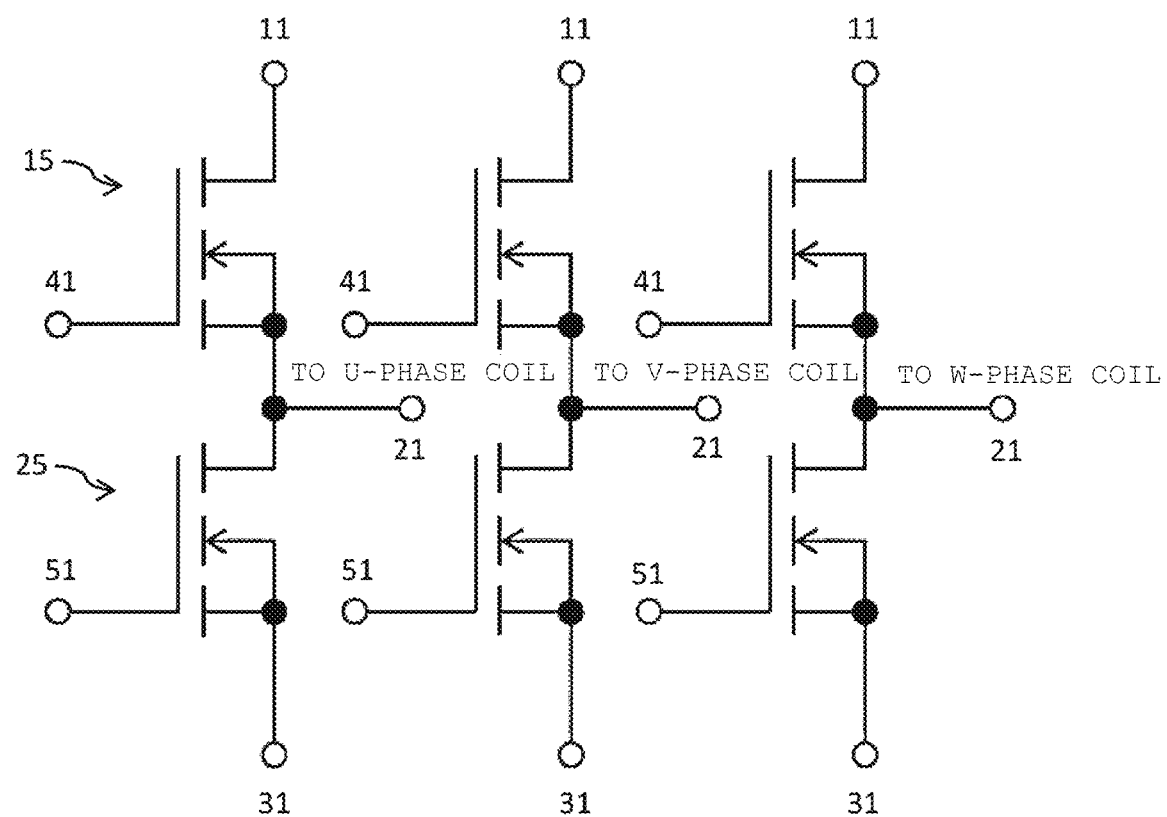
FIG. 7 is a circuit diagram of an electronic module according to embodiments of the present invention.

As an electronic module, for example, a power electronic module may be used. As the first electronic element 15 and the second electronic element 25, for example, MOSFETs may be used. A circuit diagram of the electronic module according to the present embodiment is as illustrated in FIG. 7, for example. In the aspect illustrated in FIG. 7, the first electronic element 15 and the second electronic element 25 are MOSFETs. In FIG. 2, a drain of the MOSFET that is the first electronic element 15 is positioned on the side of the first rear surface-exposed part 12, and a source is positioned on the side (the front surface side) opposite to the first rear surface-exposed part 12. Further, a drain of the MOSFET that is the second electronic element 25 is positioned on the side of the second rear surface-exposed part 22, and a source is positioned on the side (the front surface side) opposite to the second rear surface-exposed part 22.

The first rear surface-exposed conductor 10, the second rear surface-exposed conductor 20, and the third rear surface-exposed part 30 may be connected to each other. For example, the first rear surface-exposed part 12 and the second rear surface-exposed part 22 may be connected by the first connector 60 or a wire (not illustrated). Further, the second rear surface-exposed part 22 and the third rear surface-exposed part 30 may be connected by the first connector 60 or a wire (not illustrated). As the connectors 60 and 70, for example, a copper clip can be used, and for example, an aluminum wire can be used as a wire. By using wide connectors 60 and 70, the amount of current flowing can be increased.

Figure 10:
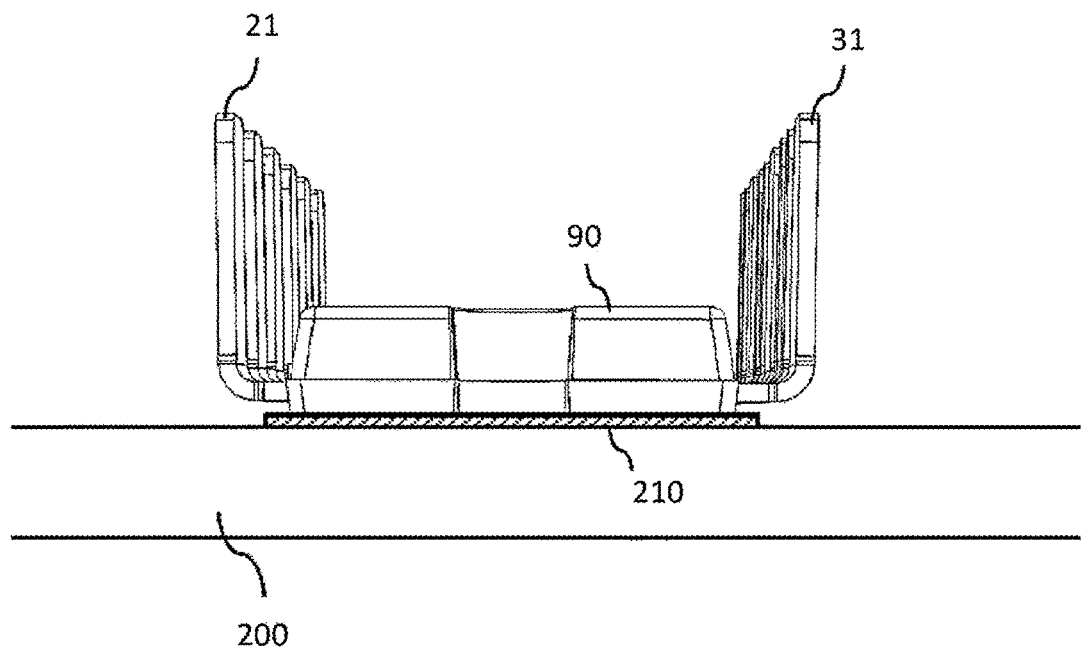
FIG. 10 is a side view indicating an aspect in which an electronic module according to embodiments of the present invention is placed on a heat radiation sheet.
Figure 10:
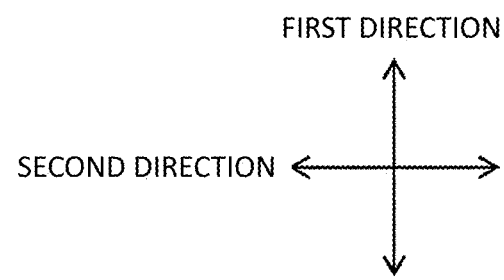

As illustrated in FIG. 10, the first rear surface-exposed part 12, the second rear surface-exposed part 22, and the third rear surface-exposed part 32 may be placed on a housing 200 via a heat radiation sheet 210, a heat radiation adhesive, and the like.

As illustrated in FIG. 3, each of the first terminal part 11, the second terminal part 21, the third terminal part 31, the fourth terminal part 41, and the fifth terminal part 51 may be bent toward the front surface side.

The electronic module of the present embodiment may be a three-phase bridge circuit. One of the three output terminals may be connected to a U-phase coil, another one may be connected to a V-phase coil, and the remaining one may be connected to a W-phase coil.

More specifically, in FIG. 7, the drain of the MOSFET which is the first electronic element 15 may be connected to the power supply line side, the source may be connected to the drain of the MOSFET which is the second electronic element 25, and the source of this MOSFET may be connected to the ground. Further, a connection point between the first electronic element 15 and the second electronic element 25 may be connected to a U-phase coil, a V-phase coil, or a W-phase coil of a motor.

Figure 9:
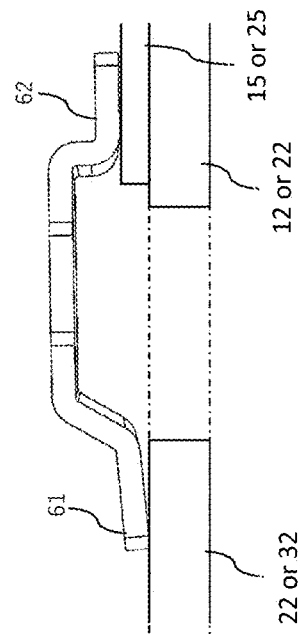
FIG. 9(a) is a side view indicating the relationship between a first connector and an electronic element and a rear surface-exposed part, which can be used in the first embodiment of the present invention.
FIG. 9(b) is a side view indicating the relationship between a second connector and an unexposed part, an electronic element, and a rear surface-exposed part, which can be used in the first embodiment of the present invention.
Figure 9:
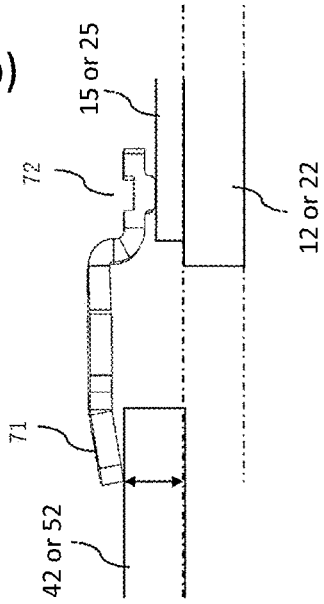

In the case where the internal bent parts 13, 23, and 33 are provided, the connection surface (including the aspect contacting with the conductive adhesive 190) between the unexposed parts 42 and 52 and the second connector 70 and the connection surface (including the aspect contacting with the conductive adhesive 190) between the rear surface-exposed parts 12, 22, and 32 and the first connector 60 differ in positions in the height direction. More specifically, in the aspect illustrated in FIG. 9, the height position of the connection surface of the second connection base end part 71 with the fourth unexposed part 42 and the height position of the connection surface of the second connection base end part 71 with the fifth unexposed part 52 are higher than the height position of the connection surface of the first connection base end part 61 with the second rear surface-exposed part 22 and the height position of the connection surface of the first connection base end part 61 with the third rear surface-exposed part 32.

Figure 8:
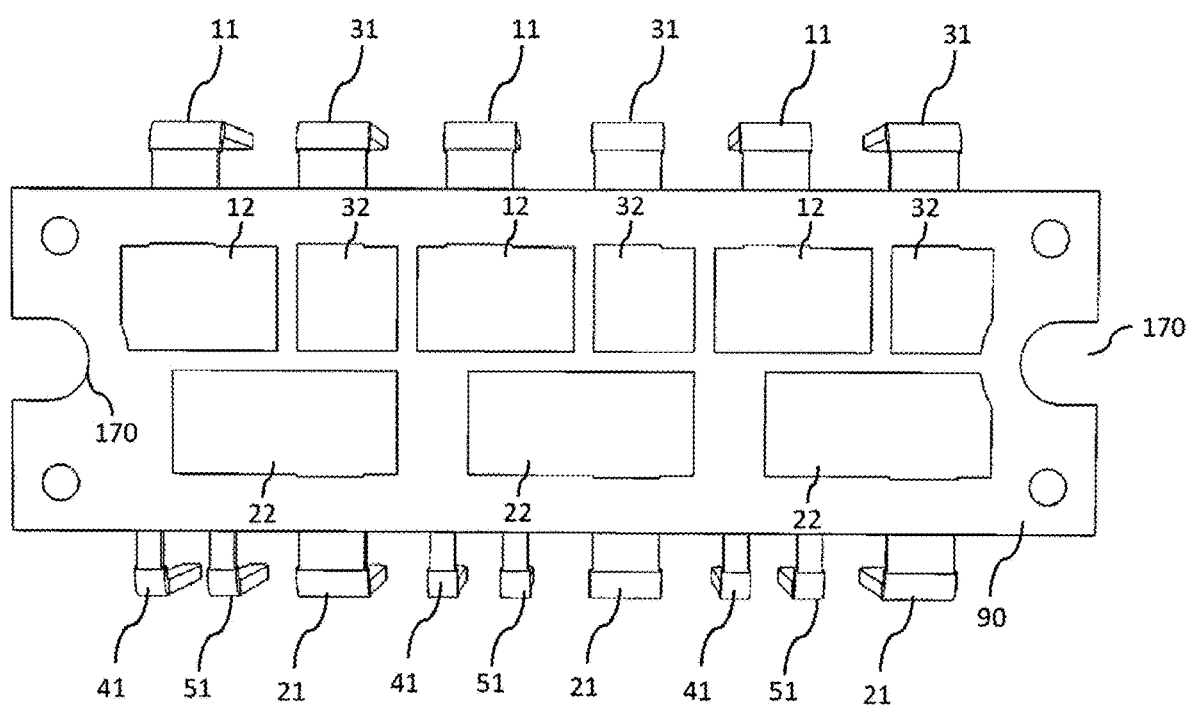
FIG. 8 is a bottom view of an electronic module according to the first embodiment of the present invention.

As illustrated in FIGS. 3 and 8, a fastening member insertion part 170 for inserting a fastening member such as a screw for fixing an electronic module to a heat sink, the housing 200, and the like may be provided on the peripheral part of the sealing part 90.

<<Function/Effect>>

Next, among the functions and effects of the present embodiment having the above-described configuration, those which have not been described yet will be described. Any of the aspects described in "Function/Effect" can be applied in the above-described configuration.

In the present embodiment, by increasing the distance H in the thickness direction between the rear surface side end part of the second connection base part 71 and the rear surface side end part of the second connection tip part 72, it is possible to sink a tip part of the second connector 70 into a conductive adhesive 190. Therefore, by adopting an aspect in which the distance H is larger than the width W of the tip part of the second connector 70, the second connector 70 can be stably disposed. As a result, defective connection of the second connector 70 can be suppressed, and reliability can be improved.

Further, by providing the second hole part 76 and increasing the diameter D of the second hole part 76, the second connection base part 71 can be sunk into the conductive adhesive 190. Therefore, by adopting an aspect in which the second hole part 76 is provided, a total value of the distance H and a total value of the diameter D of the second hole part 76 is larger than the width W of the tip part of the second connector 70, the second connector 70 can be further stably disposed. As a result, defective connection of the second connector 70 can be suppressed, and reliability can be further improved.

In the case where an aspect is applied in which the distance H in the thickness direction between the rear surface side end part of the second connection base part 71 and the rear surface side end part of the second connection tip part 72 is larger than the width W of a tip part of the second connector 70, the tip part of the second connector 70 can sink into the conductive adhesive 190 by increasing the distance H and decreasing the width W of the tip part of the second connector 70. Therefore, it is possible to improve reliability by stably arranging the second connector 70 to suppress defective connection of the second connector 70.

In the case where an aspect is applied in which the distance H in the thickness direction between the rear surface side end part of the second connection base part 71 and the rear surface side end part of the second connection tip part 72 is larger than the diameter D of the second hole part 76, the effect of increasing the distance H is prioritized over the effect of increasing the diameter D of the second hole part 76, and the tip part of the second connector 70 can sink into the conductive adhesive 190. Therefore, it is possible to improve reliability by stably arranging the second connector 70 to suppress defective connection of the second connector 70.

In the case where an aspect is applied in which the diameter D of the second hole part 76 is equal to or larger than the width W of the tip part of the second connector 70, by increasing the diameter D of the second hole part 76, the base part of the second connector 70 can sink into the conductive adhesive 190. Therefore, it is possible to improve reliability by stably arranging the second connector 70 to suppress defective connection of the second connector 70.

In the present embodiment, in the case where the aspect of which the thickness T1 of the first connector 60 for electrically connecting the electronic elements 15 and 25 to the rear surface-exposed conductors 10, 20, and 30 is thicker than the thickness T2 of the second connector 70 for electrically connecting the electronic elements 15 and 25 to the rear surface-unexposed conductors 40 and 50 is applied (refer to FIG. 11), the first connector 60 can prevent the rear surface-exposed parts 12, 22, and 32 from floating up when the rear surface-exposed parts 12, 22, and 32 are pressed by a pressing member such as a press pin to pour a sealing resin. Therefore, it is possible to prevent the resin from wrapping around to the rear surface side of the rear surface-exposed parts 12, 22, and 32 and also prevent occurrence of defective appearance and burrs.

If the thickness T1 of the first connector 60 is smaller than 1.2 times of the thickness T2 of the second connector 70, the pressing force by the first connector 60 against the rear surface-exposed parts 12, 22, and 32 may be reduced. On the other hand, if the thickness T1 of the first connector 60 is greater than 1.5 times of the thickness T2 of the second connector 70, the weight of the first connector 60 becomes too heavy, and the thickness of the conductive adhesive 190 such as solder to be disposed on the rear surface side of the first connector 60 is not sufficiently maintained, and as a result, the reliability may be lowered. Therefore, it is useful that the thickness T1 of the first connector 60 is 1.2 times or more and 1.5 times or less the thickness T2 of the second connector 70.

In the case where the aspect of which the thickness T1 of the first connector 60 is thinner than the thicknesses of the rear surface-exposed conductors 10, 20, and 30 and the rear surface-unexposed conductors 40 and 50 is applied, it is possible to prevent the weight of the first connector 60 from being too heavy and possible to sufficiently maintain the thickness of the conductive adhesive 190 such as solder to be disposed on the rear surface side of the first connector 60.

In the case where the aspect of which the first hole 66 is provided in each of the first connection base end part 61 and the first connection tip end part 62 is applied, it is advantageous in that whether or not the conductive adhesive 190 such as solder is adhered to each rear surface of the first connection base end part 61 and the first connection tip end part 62 can be visually confirmed.

As illustrated in FIG. 1(*a*), in the case where the aspect of which the width of the second connection base end part 71 is larger than the width of the second connection tip end part 72 is applied, it is advantageous in that the size in the in-plane direction of the second connector 70 can be reduced. In the case where the aspect of which the second hole 76 is provided in the second connection base end part 71 is applied, it is advantageous in that whether or not the conductive adhesive 190 such as solder is adhered to the rear surface of the second connection base end part 71 can be visually confirmed. On the other hand, in the case where the aspect of which the width of the second connection tip end part 72 is narrower than the width of the second connection base end part 71 is applied, the second connection tip end part 72 may not be provided with the second hole 76. This is because, in the case where the width of the second connection tip end part 72 is narrow, whether or not the conductive adhesive 190 such as solder is adhered to the second connection tip end part 72 without providing the second hole 76 can be visually confirmed.

In the present embodiment, in the case where the aspect of which the first connector 60 is provided corresponding to each of the rear surface-exposed parts 12, 22, and 32, and each of the rear surface-exposed parts 12, 22, and 32 is pressed by a pressing member such as a press pin when a sealing resin is poured is applied, it is possible to prevent a portion not pressed by the connectors 60 and 70 from being floated while pressing the rear surface-exposed parts 12, 22, and 32. Therefore, it is possible to prevent the resin from wrapping around to the rear surface side of the rear surface-exposed parts 12, 22, and 32 and is also possible to prevent occurrence of defective appearance and burrs.

On a front surface of a sealing part 90, pressing holes or pressing impressions 110, 120, and 130 may be provided (refer to FIG. 3). The press hole is a hole provided on the front surface of the sealing part 90. For example, after pressing the rear surface-exposed conductors 10, 20, and 30 with press pins, a part of them is sealed in the sealing part 90. The pressing impressions 110, 120, and 130 are, for example, impressions obtained such that after the rear surface-exposed conductors 10, 20, and 30 are pressed by press pins, all of them are sealed with a sealing resin. Even if all of them are sealed with a sealing resin as described above, in general, a boundary line is formed between the original sealing part and the sealing resin embedded later, and regions partitioned by the boundary line are the pressing impressions 110, 120, and 130 (refer to FIG. 3). It is possible to determine whether each of the rear surface-exposed conductors 10, 20, and 30 is pressed by a pressing member such as a press pin by the pressing holes and pressing impressions 110, 120, and 130. The aspect illustrated in FIG. 3 indicates the first pressing impression 110 for the first rear surface-exposed conductor 10, the second pressing impression 120 for the second rear surface-exposed conductor 20, and the third pressing impression 130 for the third rear surface-exposed conductor 30.

In the present embodiment, in the case where the aspect of which the rear surfaces of the rear surface-exposed parts 12, 22, and 32 on which the electronic elements 15 and 25 are placed are exposed is applied, a heat radiation effect can be expected (refer to FIGS. 2 and 8). On the other hand, in the case where the aspect of which the unexposed parts 42 and 52 are sealed in the sealing part 90 is applied, the possibility that the rear surface-unexposed conductors 40 and 50 come out from the sealing part 90 can be reduced. In this case, since the unexposed parts 42 and 52 are not exposed from the rear surface, defective appearance in the unexposed parts 42 and 52 due to burrs of the sealing part 90 is not caused. Generally, it is difficult to press down to seal with resin when the width is narrow, and burrs caused by the sealing part 90 are likely to occur. However, it is advantageous in that, by using the unexposed parts 42 and 52 not exposed outwardly, burrs are not caused.

In the case where the aspect having the internal bent parts 13, 23, and 33 as illustrated in FIGS. 5 and 6 is applied, as illustrated in FIG. 8, the rear surface-exposed conductors 10, 20, and 30 are sealed in the peripheral part of the sealing part 90, and it is possible to more reliably prevent the rear surface-exposed conductors 10, 20, and 30 from coming out from the sealing part 90. In addition, in the case where the aspect of which the rear surface of the sealing part 90 has a flat shape while using the internal bent parts 13, 23, and 33 is applied, it is possible to prevent the conductor surface from being exposed at the peripheral part of the rear surface of the sealing part 90 without providing a protruding part or the like on the rear surface of the sealing part 90. Therefore, it is also advantageous in that it is unnecessary to process a heat sink, the housing 200, and the like corresponding to the projecting part.

In the case where the conductor surface is exposed at the peripheral part of the rear surface of the sealing part 90, there is a possibility that a current leaks from an unexpected part. On the other hand, by using the internal bent parts 13, 23, and 33 as in the present embodiment, it is possible to prevent the conductor surface from being exposed at the periphery of the rear surface of the sealing part 90. As a result, it is advantageous in that the possibility that a current leaks from unexpected places can be reduced, and reliability can be improved. Further, the distance between the rear surface-exposed parts 12, 22, and 32 and the unexposed parts 42 and 52 can be increased while matching positions in the height direction of the rear surface exposed-side terminal parts 11, 21 and 31 and the rear surface unexposed-side terminal parts 41 and 51 by using such internal bent parts 13, 23, and 33. As a result, the distance between the electronic elements 15 and 25 and the unexposed parts 42 and 52 can be increased, and adverse effects on the current flowing through the rear surface unexposed-side terminal parts 41 and 51 due to heat generated from the electronic elements 15 and 25 can be prevented.

Further, by not making the conductor surface be exposed at the peripheral part of the rear surface of the sealing part 90, the size of the heat radiation sheet 95 (refer to FIG. 10) can be reduced, and also the manufacturing cost can be reduced.

As illustrated in FIG. 2, in the case where the aspect of which the first electronic element 15 is placed on the first rear surface-exposed part 12 whose rear surface is exposed is applied, heat generated from the first electronic element 15 can be efficiently dissipated. Similarly, in the case where the aspect of which the second electronic element 25 is placed on the second rear surface-exposed part 22 whose rear surface is exposed is applied, heat generated from the second electronic element 25 can be efficiently dissipated.

In the case where the aspect of which the second rear surface-exposed part 22 on which the second electronic element 25 is placed and the unexposed parts 42 and 52 on which the electronic elements 15 and 25 are not placed are positioned on one side surface side (one side surface side from the center in the short side direction, the lower side in FIG. 2) is applied, it is advantageous in that heat generated from the second electronic element 25 can be efficiently dissipated from the second rear surface-exposed part 22 on one side surface side of the rear surface.

As illustrated in FIG. 2, in the case where the aspect of which the fourth terminal part 41 and the fifth terminal part 51 are provided between the second terminal parts 21 in the longitudinal direction of the sealing part 90 is applied, the second terminal part 21 which is easily affected by heat generated from the second electronic element 25 and the fourth terminal part 41 and the fifth terminal part 51 which are not easily affected by heat generated from the electronic elements 15 and 25 can be disposed in a well-balanced manner. Therefore, the heat generated from the second electronic element 25 can be dissipated efficiently via the second terminal part 21.

In the case where the aspect of which the unexposed parts 42 and 52 are provided between a pair of the second rear surface-exposed parts 22 in the longitudinal direction of the sealing part 90 is applied, the second rear surface-exposed part 22 on which the second electronic element 25 is placed and the unexposed parts 42 and 52 on which the electronic elements 15 and 25 are not placed can be disposed in a well-balanced manner. Therefore, the heat generated from the second electronic element 25 can be dissipated efficiently via the first rear surface-exposed part 12.

In the case where the aspect of which the fourth unexposed part 42 is provided between a pair of the second rear surface-exposed parts 22 in the longitudinal direction of the sealing part 90, and the fifth unexposed part 52 is provided on one side surface side of the second rear surface-exposed part 22 is applied (the lower side in FIG. 2), it is advantageous in that the fourth unexposed part 42 and the fifth unexposed part 52 can be provided while the size of the second rear surface-exposed part 22 is increased as much as possible.

As illustrated in FIG. 2, in the case where the aspect of which the first rear surface-exposed part 12 on which the first electronic element 15 is placed and the third rear surface-exposed part 32 on which the electronic elements 15 and 25 are not placed are positioned on the other side surface side (the other side surface side from the center in the short side direction, the upper side in FIG. 2) is applied, it is advantageous in that heat generated from the first electronic element 15 can be efficiently dissipated via the first rear surface-exposed part 12 on the other side surface side of the rear surface.

In the case where the aspect of which the first terminal part 11 and the third terminal part 31 are alternately arranged is applied, the first terminal part 11, which is easily affected by heat generated from the first electronic element 15, and the third terminal part 31 which is not easily affected by heat generated from the electronic elements 15 and 25 can be disposed in a well-balanced manner. Therefore, the heat generated from the first electronic element 15 can be dissipated efficiently via the first terminal part 11.

In the case where the aspect of which the first rear surface-exposed part 12 and the third rear surface-exposed part 32 are alternately disposed is applied, the first rear surface-exposed part 12 on which the first electronic element 15 is placed and the third rear surface-exposed part 32 on which the electronic elements 15 and 25 are not placed can be disposed in a well-balanced manner. Therefore, the heat generated from the first electronic element 15 can be efficiently dissipated from the first rear surface-exposed part 12.

In the case where the aspect of which each of the first rear surface-exposed part 12, the second rear surface-exposed part 22, and the third rear surface-exposed part is formed separately is applied, those are not easily affected by high frequency or the like (noise or the like) in the other terminal part. Particularly, in a three-phase bridge circuit, the influence of high frequency or the like (noise or the like) may become a problem. Therefore, in the three-phase bridge circuit, it is extremely useful to apply the aspect of which each of the first rear surface-exposed part 12, the second rear surface-exposed part 22, and the third rear surface-exposed part is separately formed.

As illustrated in FIG. 2, by uniformly arranging a plurality of electronic elements 15 and 25, it is possible to radiate heat uniformly. Further, by equally arranging a plurality of electronic elements 15 and 25 in this manner, mounting of the electronic elements 15 and 25 can be performed quickly, and productivity can be enhanced. "Equal" in the present embodiment means that the distances between a plurality of the first electronic elements 15 have the same value, the distances between a plurality of the second electronic elements 25 have the same value, a plurality of the second electronic elements 25 is disposed on one side surface side (the lower side in FIG. 2) from the center line extending in the longitudinal direction (the right and left direction in FIG. 2) of an electronic module, a plurality of the first electronic elements 15 is disposed on the other side surface side (the upper side in FIG. 2), and the first electronic element 15 and the second electronic element 25 are disposed in a nested manner. For example, as illustrated in FIG. 2, a plurality of (three in the aspect in FIG. 2) the second electronic elements 25 is disposed at equal intervals in the right and left directions on the lower side of FIG. 2 from the longitudinal center line of the electronic module, and a plurality of (three in the aspect in the FIG. 2) the first electronic elements 15 is disposed at equal intervals in the right and left direction on the upper side of FIG. 2 from the center line in the longitudinal direction, and the first electronic element 15 and the second electronic element 25 are disposed in a nested manner. A wire can be used instead of the first connector 60 and/or the second connector 70.

When the connectors 60 and 70 such as clips are used, it is necessary to prepare the connectors 60 and 70 beforehand. However, by equally arranging a plurality of the electronic elements 15 and 25, the types of the connectors 60 and 70 to be prepared can be reduced. For example, according to the aspect illustrated in FIG. 2, the length of the first connector 60 connecting the front surface of the second electronic element 25 and the third rear surface-exposed part 32 and the length of the first connector 60 connecting the front surface of the first electronic element 15 and the second rear surface-exposed part 22 can be made substantially the same. Therefore, it is advantageous in that, for example, one type of the first connector 60 connecting the electronic elements 15 and 25 and the rear surface-exposed parts 12, 22, and 32 can be provided. Further, by using one type of the first connectors 60 for connecting the electronic elements 15 and 25 and the rear surface-exposed parts 12, 22, and 32, it is also advantageous in that the amount of current flowing through each of the first connectors 60 can be substantially the same.

In addition, as illustrated in FIG. 2, in the case where the aspect of which the fourth unexposed part 42 is provided between a pair of the second rear surface-exposed parts 22, and the fifth unexposed part 52 is provided on one side surface side of the second rear surface-exposed part 22 is applied, the length of the second connector 70 for connecting the fourth unexposed part 42 and the front surface of the first electronic element 15 and the length of the second connector 70 connecting the fifth unexposed part 52 and the front surface of the second electronic element 25 can be made substantially the same. Therefore, it is advantageous in that, for example, one type of the second connectors 70 connecting the unexposed parts 42 and 52 and the electronic elements 15 and 25 can be provided. Further, by using one type of the second connectors 70 connecting the unexposed parts 42 and 52 and the electronic elements 15 and 25 as described above, if the electronic elements 15 and 25 are the same, it is advantageous in that the electronic elements 15 and 25 can be controlled at the same current.

For example, as illustrated in FIG. 2, when the front surface of the first electronic element 15 is connected to the second rear surface-exposed part 22, the front surface of the second electronic element 25 is connected to the third rear surface-exposed part 32, the first terminal part 11 can be used as an input terminal, the second terminal part 21 can be used as an output terminal, and the third terminal part 31 can be used as a ground terminal. For this reason, the current input from one side in the short side direction of the electronic module (the upper side in FIG. 2) can flow to the other side in the short-side direction of the electronic module (the lower side in FIG. 2), and the current does not make a U-turn. Therefore, the wiring length can be suppressed, and as a result, impedance and inductance can be reduced. Further, it is possible to reduce the size of the electronic module and to reduce the cost.

Second Embodiment

Next, a second embodiment of the present invention will be described.

Figure 12:
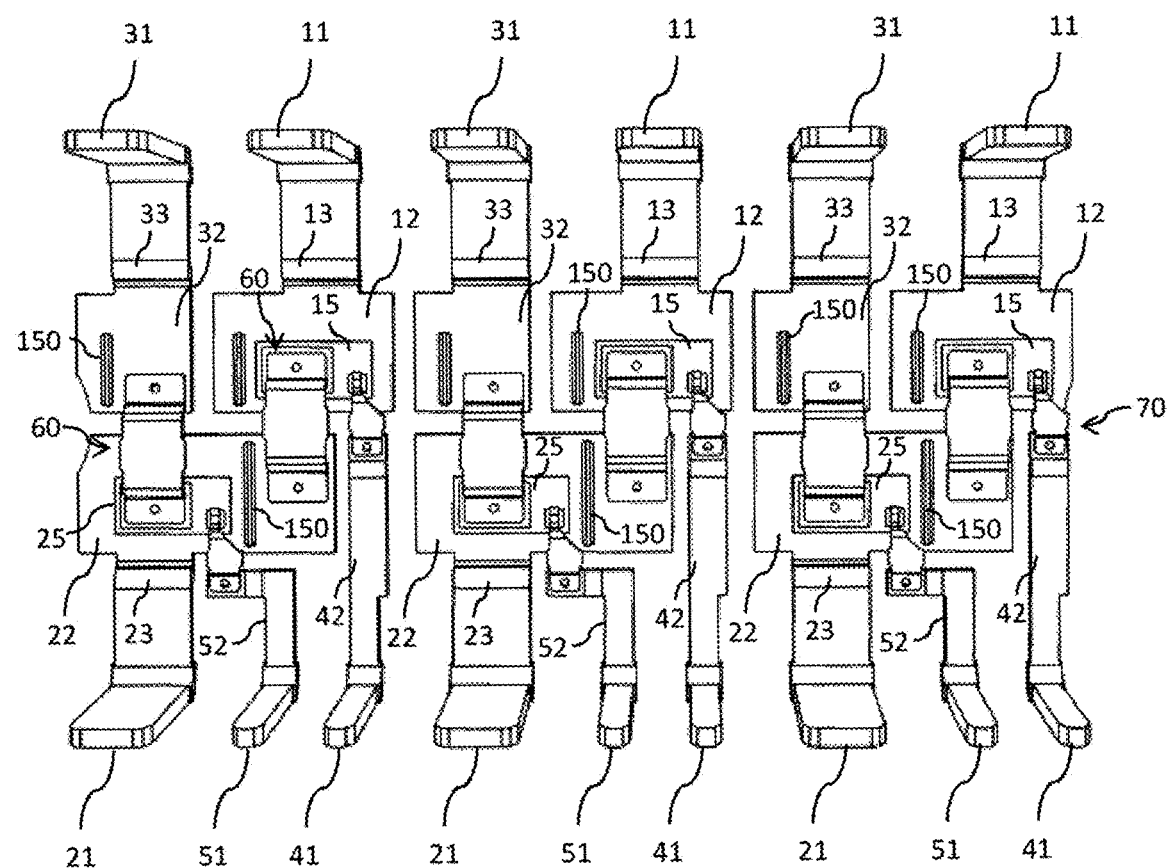
FIG. 12 is a plan view which is not illustrating a sealing part of an electronic module according to a second embodiment of the present invention.
Figure 13:
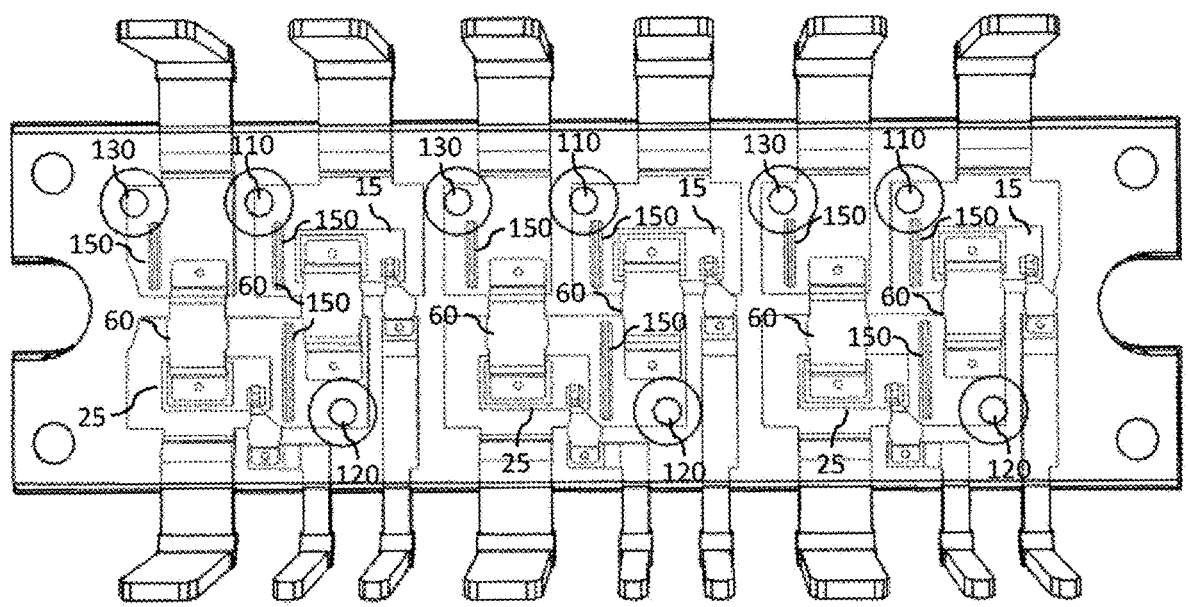
FIG. 13 is a plan view of an electronic module according to the second embodiment of the present invention and a view illustrating the sealing part in a translucent state.
Figure 13:
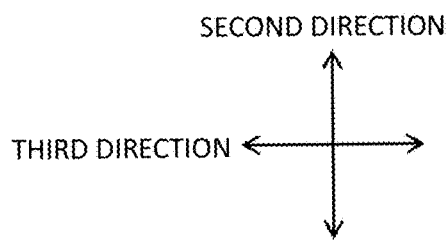

As indicated in FIG. 12, grooves 150 may be provided on the front surfaces of the rear surface-exposed parts 12, 22, and 32 of the rear surface-exposed conductors 10, 20, and 30. As indicated in FIG. 12, the groove 150 may be provided in each of the rear surface-exposed conductors 10, 20, and 30 or may be provided only in a part of the rear surface-exposed conductors 10, 20, and 30. As indicated in FIG. 13, in the longitudinal direction of the sealing part 90 in the in-plane direction, the center portion of the press holes or press impressions 110, 120, and 130 may be provided on the side opposite to the connectors 60 and 70 or the electronic elements 15 and 25 with respect to the groove 150. The groove 150 of the present embodiment does not penetrate through the rear surface-exposed parts 12, 22, and 32, and the recesses formed in the rear surface-exposed parts 12, 22, and 32 are the grooves 150. However, the present invention is not limited to such an aspect, and the groove 150 may penetrate through the rear surface-exposed parts 12, 22, and 32.

With respect to at least a part of the grooves 150, in the longitudinal direction of the sealing part 90 in the in-plane direction (the third direction in FIG. 13), the entirety of the press holes or press impressions 110, 120, and 130 may be provided on the side opposite to the connectors 60 and 70 or the electronic elements 15 and 25 with respect to the groove 150. Further, with respect to all the grooves 150, in the longitudinal direction of the sealing part 90 in the in-plane direction, the entirety of the press holes or press impressions 110, 120, and 130 may be provided on the side opposite to the connectors 60 and 70 or the electronic elements 15 and 25 with respect to the groove 150.

With respect to at least a part of the grooves 150, in the longitudinal direction of the sealing part 90 in the in-plane direction (the third direction in FIG. 13), a part of the press holes or press impressions 110, 120, and 130 may be provided on the side opposite to the connectors 60 and 70 or the electronic elements 15 and 25 with respect to the groove 150. Further, with respect to all the grooves 150, in the longitudinal direction of the sealing part 90 in the in-plane direction, only a part of the press holes or press impressions 110, 120, and 130 may be provided on the side opposite to the connectors 60 and 70 or the electronic elements 15 and 25 with respect to the groove 150.

Multiple types of the grooves 150 may be mixed, and in the longitudinal direction of the sealing part 90 in the in-plane direction in a part of a plurality of the rear surface-exposed conductors 10, 20, and 30, the entirety of the press holes or press impressions 110, 120, and 130 may be provided on the side opposite to the connectors 60 and 70 or the electronic elements 15 and 25 with respect to the groove 150, and in the longitudinal direction of the sealing part 90 in the in-plane direction, in a part of or the entirety of the remaining part, only a part of the press holes or press impressions 110, 120, and 130 may be provided on the side opposite to the connectors 60 and 70 or the electronic elements 15 and 25 with respect to the groove 150.

In the aspect illustrated in FIG. 13, a part of the first press impression 110 is provided on the side opposite to the first electronic element 15 provided on the first rear surface-exposed part 12 with respect to the groove 150 provided in the first rear surface-exposed part 12, the entirety of the second press impression 120 is provided on the side opposite to the second electronic element 25 provided in the second rear surface-exposed part 22 with respect to the groove 150 provided in the second rear surface-exposed part 22, and a part of the third press impression 130 is provided on the side opposite to the first connector 60 provided in the third rear surface-exposed part 32 with respect to the groove 150 provided in the third rear surface-exposed part 32.

As indicated in FIG. 13, the grooves 150 may not be provided in the rear surface-unexposed conductors 40 and 50. However, the present invention is not limited to such an aspect, and the grooves 150 may be provided in the rear surface-unexposed conductors 40 and 50.

In the case where the aspect of which, in the longitudinal direction of the sealing part 90 in the in-plane direction, the center portion of the press holes or press impressions 110, 120, and 130 is provided on the side opposite to the connectors 60 and 70 or the electronic elements 15 and 25 with respect to the groove 150 is applied, by deflecting a portion to be pressed by a pressing member such as a press pin to a certain extent, floating of the rear surface-exposed parts 12, 22, and 32 on the side opposite to the portion pressed by the pressing member with respect to the groove 150 can be prevented. Therefore, it is possible to prevent the resin from wrapping around to the rear surface side of the rear surface-exposed parts 12, 22, and 32 and also prevent occurrence of defective appearance and burrs.

In the case where the aspect of which, in the longitudinal direction of the sealing part 90 in the in-plane direction, the entirety of the press holes or press impressions 110, 120, and 130 are provided on the side opposite to the connectors 60 and 70 or the electronic elements 15 and 25 with respect to the groove 150 is applied, the portion to be pressed by a pressing member such as a press pin can be surely deflected, and floating of the rear surface-exposed parts 12, 22, and 32 on the side opposite to the portion pressed by the pressing member with respect to the groove 150 can be surely prevented.

Even in the case where the aspect of which, in the longitudinal direction of the sealing part 90 in the in-plane direction, only a part of the press holes or press impressions 110, 120, and 130 are provided on the side opposite to the connectors 60 and 70 or the electronic elements 15 and 25 with respect to the groove 150 is applied, the portion to be pressed by a pressing member such as a press pin can be deflected to a certain extent, and the floating of the rear surface-exposed parts 12, 22, and 32 on the side opposite to the portion pressed by the pressing member with respect to the groove 150 can be prevented to a certain extent. Further, in the case where the aspect of which only a part of the press holes or press impressions 110, 120, and 130 are provided on the side opposite to the connectors 60 and 70 or the electronic elements 15 and 25 with respect to the groove 150 is applied, since it is not necessary to increase the size of a space in the in-plane direction to be pressed with a press pin, it is advantageous in that the increase in size in the in-plane direction can be prevented.

Even in the case where the aspect of which, in the short-side direction (second direction) of the sealing part 90 in the in-plane direction, the press holes or press impressions 110, 120, and 130 are positioned between the groove 150 and the rear surface exposed-side terminal parts 11, 21 and 31 of the rear surface-exposed parts 12, 22, and 32 is applied, it is advantageous in that the increase in size in the in-plane direction can be prevented without providing a large space in the in-plane direction to be pressed with a press pin.

When multiple types of the grooves 150 are mixed, and the aspect in which the entirety of the press holes or press impressions 110, 120, and 130 are provided on the side opposite to the connectors 60 and 70 or the electronic elements 15 and 25 with respect to the groove 150 and the aspect in which only a part of the press holes or press impressions 110, 120, and 130 are provided on the side opposite to the connectors 60 and 70 or the electronic elements 15 and 25 with respect to the groove 150 are mixed, it is advantageous in that the design aspect can be appropriately changed.

In the above description, the first embodiment is described as a premise, but the present invention is not limited thereto, and only the characteristic configuration of the aspect of the present embodiment may be applied without applying the characteristic configuration of the aspect of the first embodiment. For example, unlike the first embodiment, a total value of the distance H between the rear surface side end part of the rear surface-unexposed conductors 40 and 50 and the rear surface side end part of the tip part and the diameter D of the second hole part 76 may not be larger than the width W of the tip part of the second connector 70.

Third Embodiment

Next, a third embodiment of the present invention will be described.

Figure 14:
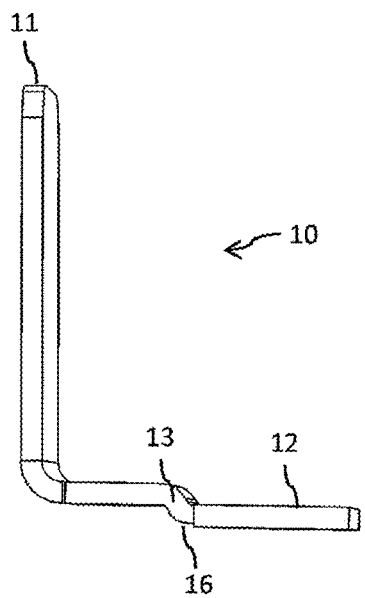
FIG. 14(a) is a side view of a first rear surface-exposed conductor that can be used in an electronic module according to a third embodiment of the present invention.
FIG. 14(b) is a side view of a second rear surface-exposed conductor that can be used in the electronic module according to the third embodiment of the present invention.
FIG. 14(c) is a side view of a third rear surface-exposed conductor that can be used in the electronic module according to the third embodiment of the present invention.
Figure 14:
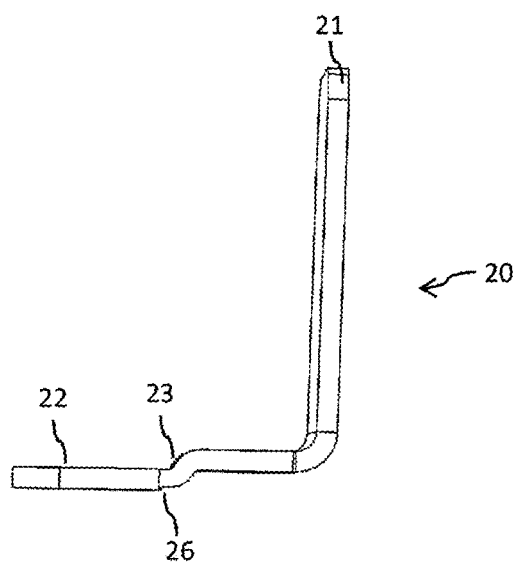
Figure 14:
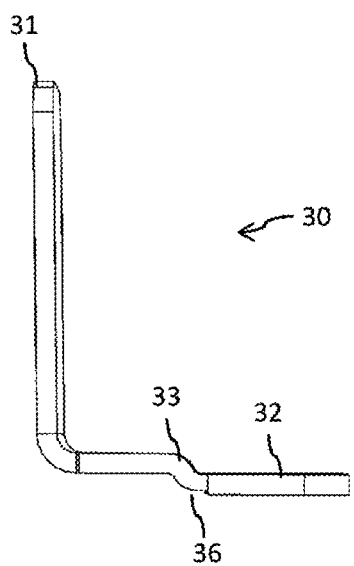

In the present embodiment, as illustrated in FIG. 14, the rear surface-exposed conductors 10, 20, and 30 are provided between the rear surface-exposed parts 12, 22, and 32 and the rear surface exposed-side terminal parts 11, 21 and 31, and the connected parts 16, 26 and 36 whose rear surface is not exposed are provided. More specifically, the connected parts 16, 26 and 36 whose rear surface is not exposed are provided between the internal bent parts 13, 23, and 33 and the rear surface-exposed parts 12, 22, and 32. The thickness of the connected parts 16, 26 and 36 is thinner than the thickness of the rear surface-exposed parts 12, 22, and 32 and the thickness of the rear surface exposed-side terminal parts 11, 21 and 31. For example, the thickness of the rear surface-exposed parts 12, 22, and 32 and the thickness of the rear surface exposed-side terminal parts 11, 21 and 31 are substantially the same, and the thickness of the connected parts 16, 26 and 36 is 0.7 to 0.9 times of the thickness of the rear surface-exposed parts 12, 22, and 32 and the thickness of the rear surface exposed-side terminal parts 11, 21 and 31. Any configuration applied in each of the above-described embodiments can also be applied in the present embodiment. The same reference numerals are used to describe the members described in the above embodiments.

By making the thickness of the connected parts 16, 26 and 36 thinner than the thickness of the rear surface-exposed parts 12, 22, and 32 and the thickness of the rear surface exposed-side terminal parts 11, 21 and 31, an unexpected exposed surface can be prevented from being formed between the rear surface-exposed parts 12, 22, and 32 and the rear surface exposed-side terminal parts 11, 21 and 31. That is, as in the present embodiment, in the case where the thin connected parts 16, 26 and 36 are not provided, and the rear surface-exposed parts 12, 22, and 32 and the rear surface exposed-side terminal parts 11, 21 and 31, which have the same thickness, are continuously connected, a part which is not sealed with a sealing resin like a void may be generated at the boundary between the rear surface-exposed parts 12, 22, and 32 and the rear surface exposed-side terminal parts 11, 21 and 31. When such a portion not sealed with a sealing resin is generated as described above, the connected parts 16, 26 and 36 positioned at the boundary between the rear surface-exposed parts 12, 22, and 32 and the terminal part are exposed on the rear surface. As a result, defective appearance is caused, and the product value may be lowered or it may not be accepted as a product. Therefore, it is advantageous that, by providing the connected parts 16, 26 and 36 as in this embodiment, the occurrence of a portion not sealed with a sealing resin is prevented at the boundary between the rear surface-exposed parts 12, 22, and 32 and the rear surface exposed-side terminal parts 11, 21 and 31.

The width of the connected parts 16, 26 and 36 may be substantially the same as the width of the rear surface exposed-side terminal parts 11, 21 and 31. That is, although the thickness of the connected parts 16, 26 and 36 is thinner than that of the rear surface exposed-side terminal parts 11, 21 and 31, the width may be substantially the same as that of the rear surface exposed-side terminal parts 11, 21 and 31. When such an aspect is applied, it is advantageous in that the appearance from the front surface side or the rear surface side can be improved.

In the above description, each embodiment is described as a premise, but the present invention is not limited thereto, and only the characteristic configuration of the aspect of the present embodiment may be applied without applying the characteristic configuration of the aspect of each embodiment.

Fourth Embodiment

Next, a fourth embodiment of the present invention will be described.

Figure 15:
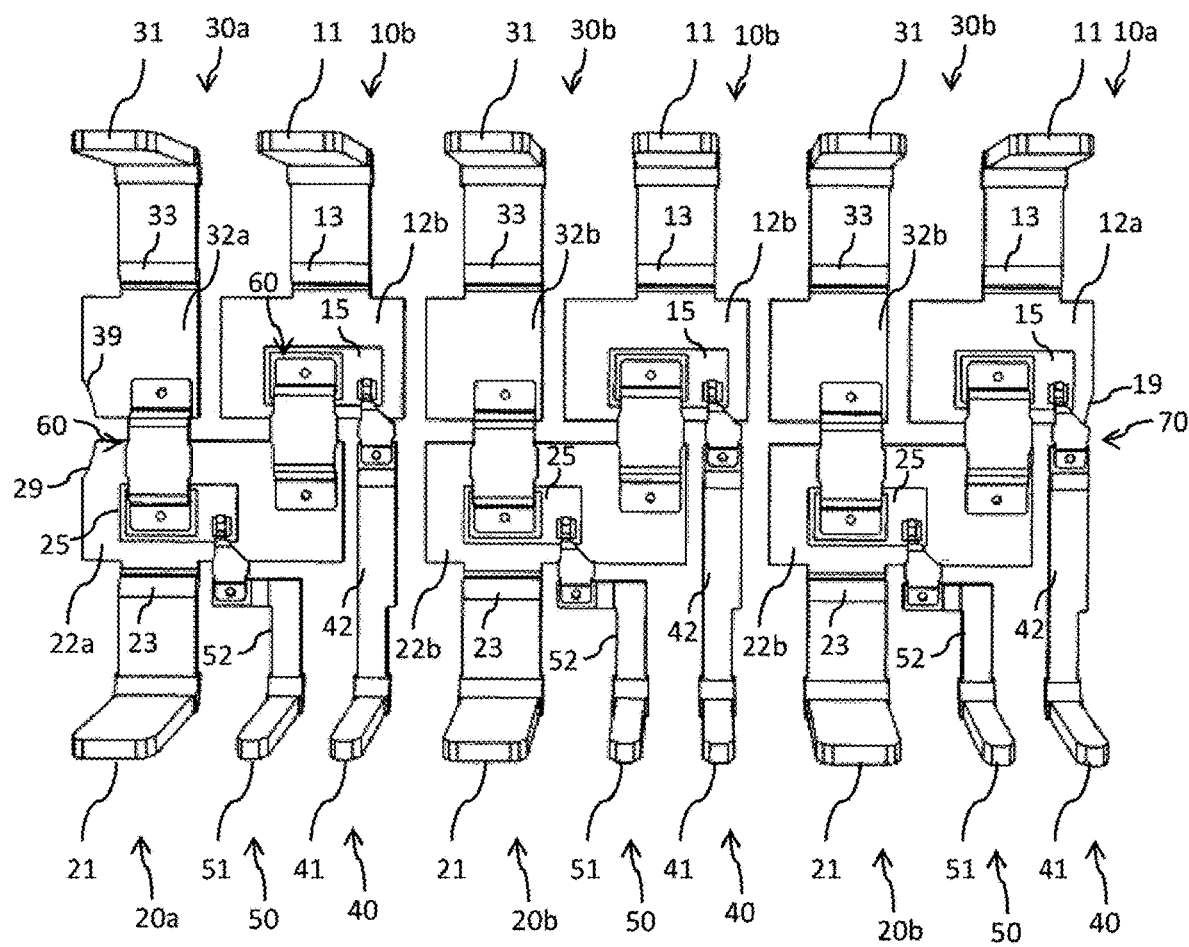
FIG. 15 is a plan view which is not illustrating a sealing part of an electronic module according to a fourth embodiment of the present invention.
Figure 15:
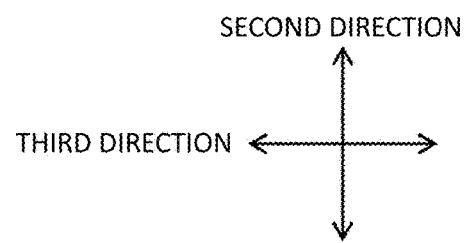

The rear surface-exposed conductors 10, 20, and 30 have a peripheral rear surface-exposed conductor and an inner rear surface-exposed conductor provided at a position farther from the fastening member insertion part 170 than the peripheral rear surface-exposed conductor. The area of the rear surface-exposed part of the peripheral rear surface-exposed conductor is smaller than the area of the rear surface-exposed part of the inner rear surface-exposed conductor. In the aspect illustrated in FIG. 15, a second rear surface-exposed conductor 20a and a third rear surface-exposed conductor 30a positioned at the left end part of FIG. 15 and a first rear surface-exposed conductor 10a positioned at the right end part of FIG. 15 are peripheral rear surface-exposed conductors, and the rear surface-exposed conductors 10, 20, and 30 other than the above are inner rear surface-exposed conductors 10b, 20b, and 30b. Any configuration applied in each of the above-described embodiments can also be applied in the present embodiment. The same reference numerals are used to describe the members described in the above embodiments.

When a fastening member is inserted and fastened to the fastening member insertion part 170 (refer to FIG. 3), the rear surface-exposed conductors 10, 20, and 30 are pressed against a heat sink or a cooling body such as the housing 200 (refer to FIG. 10), and the cooling efficiency increases. The peripheral rear surface-exposed conductor close to the fastening member insertion part 170 is strongly pressed against a cooling body as compared with the inner rear surface-exposed conductor, and therefore the cooling efficiency is further enhanced. As in the present embodiment, by reducing the area of rear surface-exposed parts 12a, 22a, and 32a of the peripheral rear surface-exposed conductors 10a, 20a, and 30a is made smaller than the area of rear surface-exposed parts 12b, 22b, and 32b of the inner rear surface-exposed conductors 10b, 20b, and 30b, it is advantageous in that the cooling efficiency for each of the electronic elements 15 and 25 can be set to about the same level, and the size in the in-plane direction can be reduced.

The rear surface-exposed parts 12a, 22a, and 32a of the peripheral rear surface-exposed conductors 10a, 20a, and 30a have inclined parts 19, 29, and 39. By providing the inclined parts 19, 29, and 39, the area of the rear surface-exposed parts 12, 22, and 32 may be reduced. In the case where the aspect of which the inclined parts 19, 29, and 39 are provided as described above is applied, it is advantageous in that the processing thereof is easy even if the area of the rear surface-exposed parts 12, 22, and 32 is reduced.

In the present embodiment, a pair of the fastening member insertion parts 170 is provided. In the present embodiment, as compared with the area of the rear surface-exposed parts 12b, 22b, and 32b of the inner rear surface-exposed conductors 10b, 20b, and 30b, the reduction amount of the rear surface-exposed parts 12a and 32a of the peripheral rear surface-exposed conductors 10a and 30a on one side (left side in FIG. 15) may be larger than the reduction amount of the rear surface-exposed part 22a of the peripheral rear surface-exposed conductor 20a on the other side (the right side in FIG. 15). In particular, the reduction amount of the rear surface-exposed parts 22a and 32a of the peripheral rear surface-exposed conductors 20a and 30a may be increased since heat dissipation can also be expected on the side where wide terminals, both the first terminal part 11 and the third terminal part 31 in the aspect illustrated in FIG. 15, are provided, in comparison with the side where narrow terminals, the fourth terminal part 41 and the fifth terminal part 51 in the aspect illustrated in FIG. 15, are provided. By applying such an aspect, it is advantageous in that the size in the in-plane direction can be further reduced.

In the above description, each embodiment is described as a premise, but the present invention is not limited thereto, and only the characteristic configuration of the aspect of the present embodiment may be applied without applying the characteristic configuration of the aspect of each embodiment.

The descriptions of the above-described embodiments and the disclosure of the drawings are merely examples for explaining the invention described in claims, and the invention described in claims is not limited by the description of the above-described embodiments or the disclosure of the drawings. In addition, the description in claims at the beginning of the application is merely an example, and the description of claims can be appropriately changed based on the description in the specification, drawings, and the like.

REFERENCE SIGNS LIST 10 first rear surface-exposed conductor
11 first terminal part (rear surface exposed-side terminal part)
12 first rear surface-exposed part (rear surface-exposed part)
15 first electronic element (electronic element)
16 connected part
20 second rear surface-exposed conductor
21 second terminal part (rear surface exposed-side terminal part)
22 second rear surface-exposed part (rear surface-exposed part)
25 second electronic element (electronic element)
26 connected part
30 third rear surface-exposed conductor
31 third terminal part (rear surface exposed-side terminal part)
32 third rear surface-exposed part (rear surface-exposed part)
36 connected part
40 first rear surface-unexposed conductor (rear surface-unexposed conductor)
50 second rear surface-unexposed conductor (rear surface-unexposed conductor)
60 first connector
70 second connector
71 second connection base part
72 second connection tip part
76 second hole part
90 sealing part
110 first press impression
120 second press impression
130 third press impression
170 fastening member insertion part

The invention claimed is:
1. An electronic module comprising:
a sealing part;
a rear surface-exposed conductor having a rear surface-exposed side terminal part protruding outward from a side surface of the sealing part and a rear surface-exposed part whose rear surface is exposed;
a rear surface-unexposed conductor, whose rear surface is not exposed, having a rear surface-unexposed side terminal part protruding outward from a side surface of the sealing part;
an electronic element provided in the sealing part and provided on a front surface of the rear surface-exposed conductor; and
a second connector for electrically connecting the electronic element to the rear surface-unexposed conductor, wherein the rear surface-unexposed conductor is positioned on a front surface side compared with the rear surface-exposed part,
the second connector has a second connection tip part and a second connection base part, the second connection tip part is positioned on a rear surface side compared with the second connection base part, and
a distance H in a thickness direction between a rear surface side end part of the second connection base part and a rear surface side end part of the second connection tip part is larger than a width W of the second connection tip part of the second connector.

2. The electronic module according to claim 1, wherein the second connection base part of the second connector has a second hole part, and
a total value of the distance H in the thickness direction between the rear surface side end part of the second connection base part and the rear surface side end part of the second connection tip part and a diameter D of the second hole part is larger than the width W of the second connection tip part of the second connector.

3. The electronic module according to claim 1, wherein the second connection base part of the second connector has a second hole part, and
the distance H in the thickness direction between the rear surface side end part of the second connection base part and the rear surface side end part of the second connection tip part is larger than a diameter D of the second hole part.

4. The electronic module according to claim 1, wherein the second connection base part of the second connector has a second hole part, and
a diameter D of the second hole part is equal to or larger than the width W of the second connection tip part of the second connector.

5. The electronic module according to claim 1, wherein the rear surface-exposed conductor has an internal bent part bent in the sealing part, and
the rear surface-unexposed conductor does not have an internal bent part.

6. The electronic module according to claim 1, wherein the rear surface-exposed conductor has a connected part which is provided between the rear surface-exposed part and the rear surface-exposed side terminal part, and whose rear surface is not exposed, and
a thickness of the connected part is thinner than a thickness of the rear surface-exposed part and a thickness of the rear surface-exposed side terminal part.

7. The electronic module according to claim 1, further comprising a fastening member insertion part provided at a peripheral part of the sealing part and configured to insert a fastening member,
wherein the rear surface-exposed conductor has a peripheral rear surface-exposed conductor and an inner rear surface-exposed conductor provided at a position farther from the fastening member insertion part than the peripheral rear surface-exposed conductor, and
an area of the rear surface-exposed part of the peripheral rear surface-exposed conductor is smaller than an area of the rear surface-exposed part of the inner rear surface-exposed conductor.

8. The electronic module according to claim 6, wherein a pair of fastening member insertion parts is provided, and
in comparison with the area of the rear surface-exposed part of the inner rear surface-exposed conductor, a reduction amount of the rear surface-exposed part of the peripheral rear surface-exposed conductor on one side is larger than a reduction amount of the rear surface-exposed part of the peripheral rear surface-exposed conductor on the other side.

\* \* \* \* \*